(12) United States Patent
Kobayashi (10) Patent No.: US 8,170,171 B2
(45) Date of Patent: May 1, 2012

(54) COMMUNICATION SEMICONDUCTOR INTEGRATED CIRCUIT

(75) Inventor: Hiroyuki Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 750 days.

(21) Appl. No.: 12/356,870

(22) Filed: Jan. 21, 2009

(65) Prior Publication Data

US 2009/0190694 A1   Jul. 30, 2009

(30) Foreign Application Priority Data

Jan. 28, 2008   (JP) .................................. 2008-016107

(51) Int. Cl.
  *H03D 3/24*   (2006.01)
(52) U.S. Cl. ...................................................... 375/376
(58) Field of Classification Search .................. 375/302, 375/354, 373, 374, 375, 376; 327/156, 159; 331/16, 167
  See application file for complete search history.

(56) References Cited

U.S. PATENT DOCUMENTS

| | | | |
|---|---|---|---|
| 7,605,662 B2 * | 10/2009 | Kobayashi et al. | 331/11 |
| 7,812,684 B2 * | 10/2010 | Kobayashi | 332/145 |
| 7,994,867 B2 * | 8/2011 | Kobayashi | 331/1 A |
| 2002/0136339 A1 * | 9/2002 | Schulz et al. | 375/371 |
| 2007/0085579 A1 * | 4/2007 | Wallberg et al. | 327/156 |
| 2007/0085623 A1 * | 4/2007 | Staszewski et al. | 331/182 |
| 2007/0188244 A1 * | 8/2007 | Waheed et al. | 331/16 |
| 2008/0315928 A1 * | 12/2008 | Waheed et al. | 327/159 |
| 2008/0317187 A1 * | 12/2008 | Waheed et al. | 375/376 |
| 2009/0322439 A1 * | 12/2009 | Mayer et al. | 332/118 |

OTHER PUBLICATIONS

Robert Bogdan Staszewski, et al., "All-Digital PLL and Transmitter for Mobile Phones", IEEE Journal of Solid-State Circuits, vol. 40, No. 12, Dec. 2005, 7 pages.
Siraj Akhtar, et al., "Quad Band Digitally Controlled Oscillator for WCDMA Transmitter in 90nm CMOS", IEEE 2006 Custom Intergrated Circuits Conference (CICC), 2006, 2 Pages.
Robert Bogdan Staszewski, et al., "LMS-Based Calibration of an RF Digitally Controlled Oscillator for Mobile Phones", IEEE Transactions on Circuits and Systems—II: Express Briefs, vol. 53, No. 3, Mar. 2006, 3 Pages.

* cited by examiner

*Primary Examiner* — Jaison Joseph
(74) *Attorney, Agent, or Firm* — Oblon, Spivak, McClelland, Maier & Neustadt, L.L.P.

(57) ABSTRACT

A communication semiconductor integrated circuit, has: a first computing element which adds the count value and the phase difference value and outputs a first computed value as an addition result; a second computing element which adds set frequency data obtained by dividing a carrier frequency by a reference frequency of the reference signal and modulation frequency data obtained by dividing a modulation frequency by the reference frequency, and outputs a second computed value as an addition result; a third computing element which subtracts the second computed value from the first computed value and outputs a third computed value as a subtraction result, the third computed value being a phase error; and a fourth computing element which adds the carrier frequency control value and the modulation frequency control value, and outputs the oscillator tuning word as an addition result.

10 Claims, 8 Drawing Sheets

COMMUNICATION SEMICONDUCTOR INTEGRATED CIRCUIT

CROSS-REFERENCE TO RELATED APPLICATION

This application is based upon and claims the benefit of priority from the prior Japanese Patent Application No. 2008-016107, filed on Jan. 28, 2008, the entire contents of which are incorporated herein by reference.

BACKGROUND OF THE INVENTION

1. Field of the Invention

The present invention relates to a communication semiconductor integrated circuit using a polar modulation scheme such as quadrature amplitude modulation (QAM).

2. Background Art

Currently in a generally used I/Q modulation scheme, modulation is performed such that frequency modulation data is represented as points on X-Y coordinates, the frequency modulation data is converted to intersecting X-Y signals, and the X-Y signals are multiplied by a carrier frequency.

On the other hand, in a polar modulation scheme having been used in recent years, modulation is performed such that frequency modulation data is represented as amplitudes and angles, modulation in an angle direction is performed as frequency modulation by a frequency synthesizer (hereinafter, will be referred to as a phase-locked loop (PLL)), and modulation in an amplitude direction is performed by controlling the gain of a power amplifier (hereinafter, will be referred to as a PA).

In a modulation scheme enabling phase modulation, as described above, each data point is expressed as phase information at a certain point in time.

However, in terms of property, a PLL circuit is a circuit for controlling a frequency and thus cannot directly perform phase modulation with phase data even when the data is fed from the outside.

For this reason, phase modulation is performed in view of the fact that a phase is an integral of a frequency.

In some communication semiconductor integrated circuits for frequency modulation according to the prior art, all-digital PLLs (ADPLLs) are used (for example, see IEEE Trans. Circuits Syst. II Analog Digit. Signal Process vol. 53 No. 3, pp. 225 to 229, March 1996).

In order to obtain a phase shift, a phase change of a unit clock has to be provided as frequency modulation.

In such an ADPLL, substantially all the circuits are operated as digital circuits and the phase data is normalized.

However, a digitally controlled oscillator (DCO) composing the DPLL is controlled by a digital value. The DCO basically has analog characteristics. In other words, a feature of the DCO is an output frequency which is not always kept constant relative to a control value.

Thus in the ADPLL, a coefficient corresponding to gain smoothing is multiplied by the output of a loop filter in order to form a feedback system in which fluctuations in the gain of the DCO and the slope of the gain are stabilized.

When a proper value is obtained, a phase modulation amount obtained by the modulation data of the DCO and a smoothing amount for offsetting the phase modulation amount are equal to each other in the ADPLL. Thus the PLL enables frequency modulation in a wide band including a band outside a loop band.

It is therefore the most important to obtain the correct frequency gain of the DCO to perform correct frequency modulation in a closed loop.

In the prior art, a gain is obtained by adjusting a frequency around a carrier frequency (for example, a detuning frequency is adjusted in Blue Tooth and so on) while using the behaviors of a loop at that time.

Such a scheme is ideal but a modulation scheme enabling wide-band frequency modulation causes the following problems:

(1) Accuracy is sacrificed by modulation based on minute frequency steps.
(2) The gain is not constant in a wide band.

SUMMARY OF THE INVENTION

According to one aspect of the present invention, there is provided: a communication semiconductor integrated circuit, comprising:

a digital control oscillator capable of controlling an oscillatory frequency of an oscillation signal based on an oscillator tuning word which is a digital value;

a counter which counts a wave number of the oscillation signal and outputs a count value;

a time to digital converter which outputs a phase difference value between a reference signal and the oscillation signal as a digital value;

a first computing element which adds the count value and the phase difference value and outputs a first computed value as an addition result;

a second computing element which adds set frequency data obtained by dividing a carrier frequency by a reference frequency of the reference signal and modulation frequency data obtained by dividing a modulation frequency by the reference frequency, and outputs a second computed value as an addition result;

a third computing element which subtracts the second computed value from the first computed value and outputs a third computed value as a subtraction result, the third computed value being a phase error;

a loop filter which outputs a normalized control value obtained by filtering the third computed value;

a first multiplier which outputs a carrier frequency control value obtained by multiplying an output of the loop filter by a first coefficient;

a second multiplier which outputs a modulation frequency control value obtained by multiplying the modulation frequency data by a second coefficient; and a fourth computing element which adds the carrier frequency control value and the modulation frequency control value, and outputs the oscillator tuning word as an addition result, wherein the second coefficient "Km" has a relationship of:

$$Km = Kc + A \times F\mathrm{mod}/F\mathrm{ref}$$

where "Kc" is the first coefficient, "A" is a correction term as a real number, "Fmod" is the modulation frequency, and "Fref" is the reference frequency.

DETAILED DESCRIPTION

Embodiments to which the present invention is applied will be described below in accordance with the accompanying drawings.

First Embodiment

Figure 1:
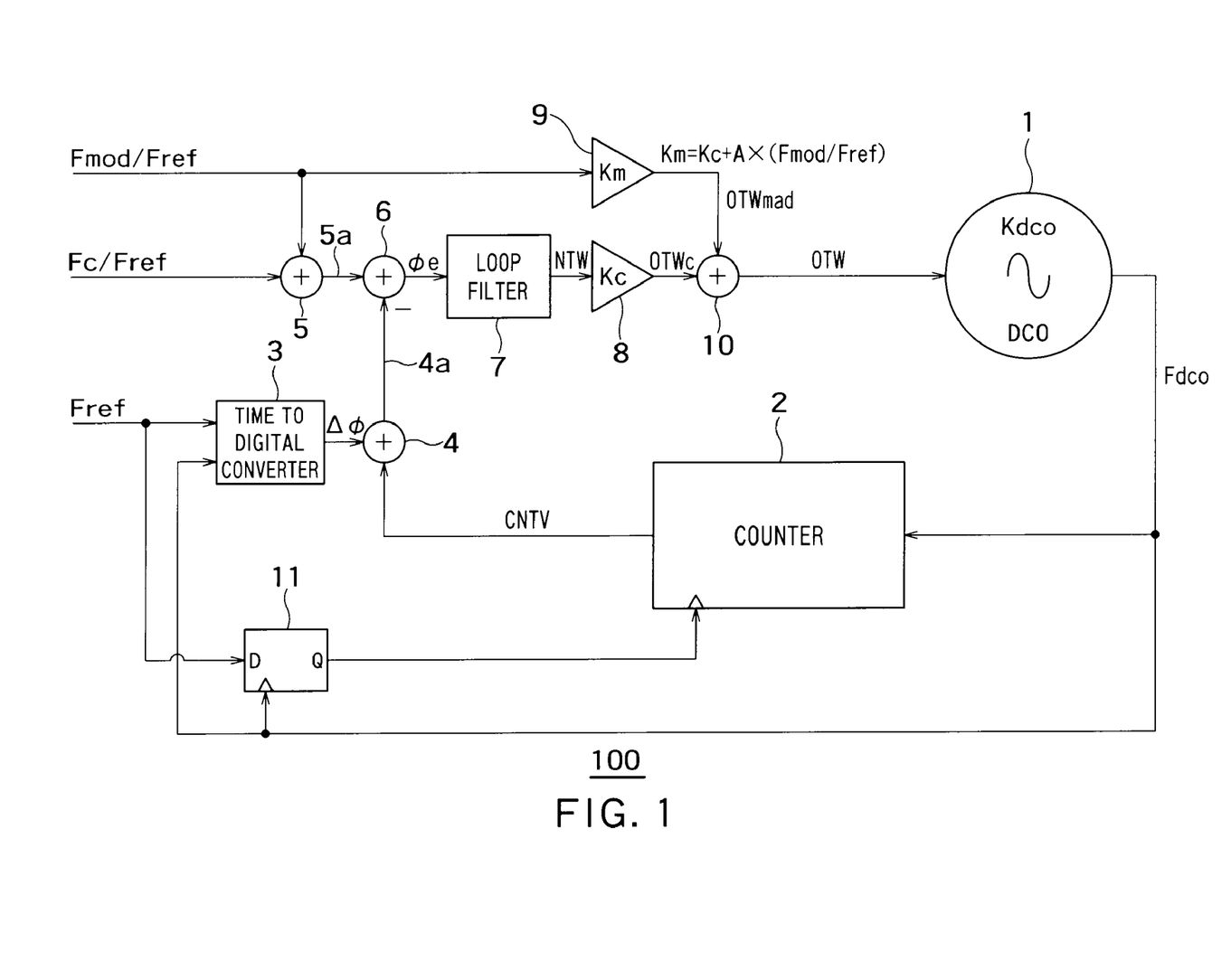
FIG. 1 is a block diagram showing an example of the configuration of a communication semiconductor integrated circuit 100 according to a first embodiment which is an aspect of the present invention.

FIG. 1 shows an example of the configuration of a communication semiconductor integrated circuit 100 according to a first embodiment which is an aspect of the present invention.

As shown in FIG. 1, the communication semiconductor integrated circuit 100 includes a digital control oscillator (DCO) 1, a counter 2, a time to digital converter (TDC) 3, a first computing element (adder) 4, a second computing element (adder) 5, a third computing element (adder) 6, a loop filter 7, a first multiplier 8, a second multiplier 9, a fourth computing element 10, and a flip-flop 11.

The digital control oscillator 1 can control an oscillatory frequency "Fdco" of an oscillation signal based on an oscillator tuning word "OTW" which is a digital value.

In this case, a gain "Kdco" of the digital control oscillator 1 is defined as a change of the oscillatory frequency relative to a change of the oscillator tuning word "OTW" (Fdco/OTW) around a carrier frequency "Fc".

Figure 2:
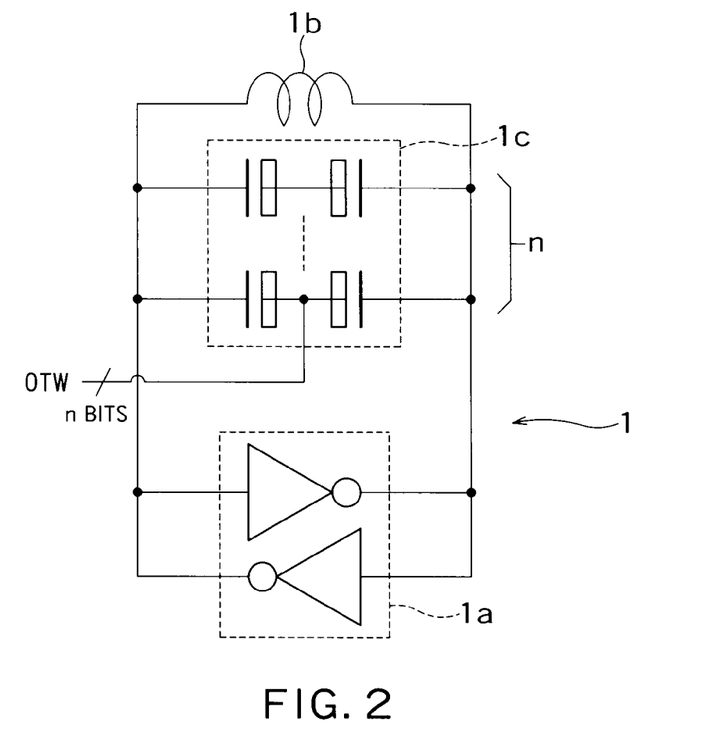
FIG. 2 is a circuit diagram showing an example of the schematic configuration of the digital control oscillator 1 shown in FIG. 1.
Figure 3:
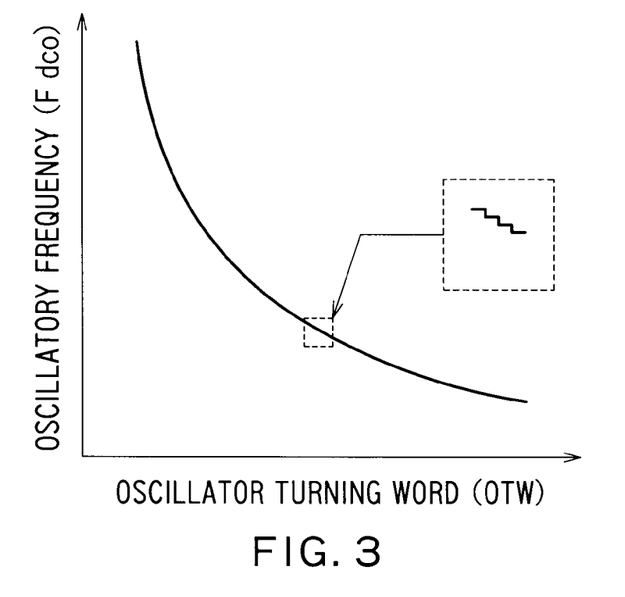
FIG. 3 is a graph showing the relationship between the oscillator tuning word "OTW" and the oscillatory frequency "Fdco" of the digital control oscillator.

FIG. 2 is a circuit diagram showing an example of the schematic configuration of the digital control oscillator 1 shown in FIG. 1. FIG. 3 shows the relationship between the oscillator tuning word "OTW" and the oscillatory frequency "Fdco" of the digital control oscillator.

As shown in FIG. 2, the digital control oscillator 1 includes an inverter circuit 1a, an inductor 1b connected in parallel with the inverter circuit 1a, and n variable capacitors 1c connected in parallel with the inductor 1b. The inductor 1b and the variable capacitors 1c compose a resonator.

As shown in FIGS. 2 and 3, in the digital control oscillator 1, the capacitance of the variable capacitor 1c is controlled by, for example, the oscillator tuning word "OTW" which is an n-bit digital value. Thus the oscillatory frequency "Fdco" of the digital control oscillator 1 is controlled in a discrete manner.

Further, as shown in FIG. 3, a change of the oscillatory frequency "Fdco" relative to a change of the oscillator tuning word "OTW" varies with the value of the oscillatory frequency "Fdco". That is to say, a wide band has nonlinearity depending upon $1/\sqrt{LC}$ of a change of the oscillatory frequency relative to the oscillator tuning word "OTW". In other words, in a wide band, linearity is not established between the oscillator tuning word "OTW" and the oscillatory frequency "Fdco".

As shown in FIG. 1, the flip-flop 11 has a data terminal D fed with a reference signal and a clock terminal fed with an oscillation signal. The flip-flop 11 outputs from an output terminal Q a clock signal synchronized with the oscillation signal.

The counter 2 is fed with the oscillation signal, counts the wave number of the oscillation signal in synchronization with the output signal of the flip-flop 11, and outputs a count value CNTV.

The time to digital converter 3 outputs a phase difference value $\Delta\Phi$ between the reference signal and the oscillation signal as a digital value.

The first computing element 4 adds the count value CNTV and the phase difference value $\Delta\Phi$ and outputs a first computed value 4a as the addition result.

The second computing element 5 adds set frequency data (Fc/Fref) which is obtained by dividing the carrier frequency "Fc" by a reference frequency "Fref" of the reference signal and modulation frequency data (Fmod/Fref) which is obtained by dividing a modulation frequency "Fmod" by the reference frequency "Fref". Further, the second computing element 5 outputs a second computed value 5a as the addition result.

As described above, the set frequency data (Fc/Fref) and the modulation frequency data (Fmod/Fref) are normalized by the reference signal.

The third computing element 6 subtracts the second computed value 5a from the first computed value 4a and outputs a third computed value $\Phi e$, which is a phase error, as the subtraction result.

The loop filter 7 outputs a normalized tuning word (NTW) which is a digital value obtained by filtering the third computed value $\Phi e$.

The first multiplier 8 outputs a carrier frequency control value "OTWc" obtained by multiplying the output of the loop filter 7 by a first coefficient "Kc".

The first coefficient "Kc" is a value obtained by dividing the reference frequency by the gain "Kdco" around the carrier frequency "Fc" of the digital control oscillator 1.

When the oscillatory frequency of the digital control oscillator 1 is the carrier frequency (that is, when the modulation frequency "Fmod" is "0"), the carrier frequency control value "OTWc" is equal to the oscillator tuning word "OTW". The carrier frequency control value "OTWc" causes a feedback loop to converge to a constant value in a steady state.

The second multiplier 9 outputs a modulation frequency control value "OTWmod" obtained by multiplying the modulation frequency data (Fmod/Fref) by a second coefficient "Km". The second coefficient "Km" has the relationship of Km=Kc+A×Fmod/Fref ("A" is a correction term (real number)).

The fourth computing element 10 adds the carrier frequency control value "OTWc" and the modulation frequency control value "OTWmod" and outputs the oscillator tuning word "OTW" as the addition result.

The following will describe the characteristics of the communication semiconductor integrated circuit 100 configured thus, in comparison with the characteristics of the prior art.

Figure 4:
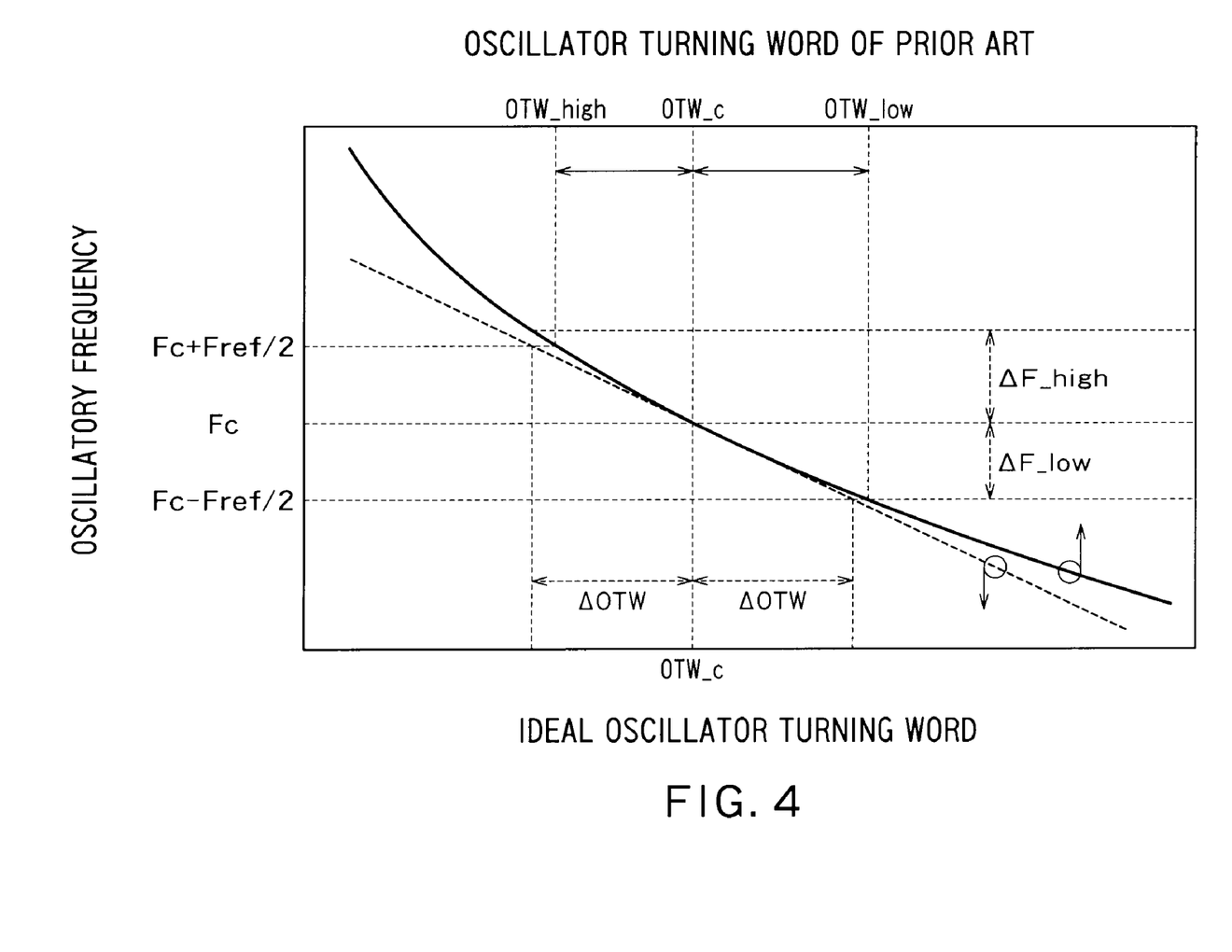
FIG. 4 is a graph showing the relationship between the oscillatory frequency "Fdco" and the oscillator tuning word "OTW" in an ideal case where the oscillatory frequency "Fdco" linearly changes with the oscillator tuning word "OTW" and in the case of the prior art.

FIG. 4 shows the relationship between the oscillatory frequency "Fdco" and the oscillator tuning word "OTW" in an ideal case where the oscillatory frequency "Fdco" linearly changes with the oscillator tuning word "OTW" and in the case of the prior art.

As shown in FIG. 4, when the gain "Kdco" of the digital control oscillator is a constant (that is, in the ideal case), a change of the oscillator tuning word "OTW" relative to the carrier frequency "Fc" is ΔOTW in both cases during frequency modulation of ±Fref/2.

However, as illustrated in FIG. 3, the effect of $1/\sqrt{LC}$ is generated. Thus in a digital control oscillator of the prior art, the oscillatory frequency "Fdco" does not linearly change with the oscillator tuning word "OTW" even in the case of equal unit capacitances for switching frequencies.

The following will examine the case where an ADPLL is locked at the carrier frequency "Fc" in the digital control oscillator of the prior art. In this case, when frequency modulation is performed on the assumption that the gain "Kdco" linearly inclines, an actual output frequency becomes high (ΔFhigh becomes large relative to "Fc") on the high-frequency side and the actual output frequency becomes high (ΔFlow becomes small relative to "Fc") on the low-frequency side.

Thus in order to obtain the oscillatory frequency "Fdco" linearly changing relative to the modulation frequency "Fmod", the oscillator tuning word "OTW" has to be controlled to be small on the high-frequency side and to be large on the low-frequency side.

For example, when the above control is not performed, wide-band modulation at about 40 MHz causes an error of about 1%, so that excellent communication characteristics cannot be obtained.

In order to achieve all kinds of phase modulation using frequency modulation, it is only necessary to perform phase modulation of ±π. Thus when the operating frequency of the ADPLL is the reference frequency "Fref", frequency modulation at not more than ±Fref/2 enables phase modulation of ±π. In this case, for example, the ADPLL operated at Fref=+1 Hz for one second can achieve phase modulation of 2π. For example, in the case of Fref=1 Hz, phase modulation of 2π can be achieved by operating the ADPLL at a frequency of Fc+1 Hz relative to the carrier frequency "Fc" for one second.

The following will describe a configuration for controlling the oscillatory frequency "Fdco" to linearly change the oscillatory frequency "Fdco" relative to the modulation frequency "Fmod".

Figure 5:
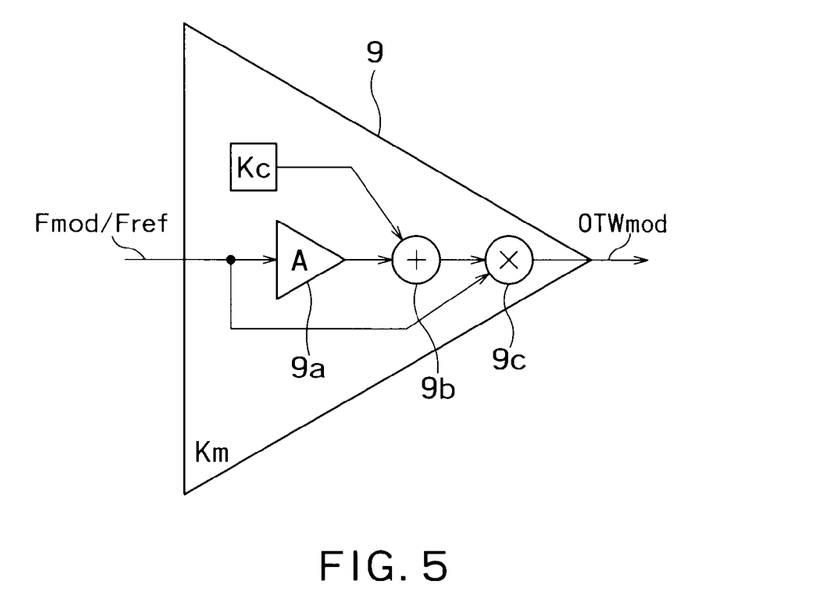
FIG. 5 is a circuit diagram showing an example of the configuration of the second multiplier 9 in the communication semiconductor integrated circuit 100 according to the first embodiment.

FIG. 5 shows an example of the configuration of the second multiplier 9 in the communication semiconductor integrated circuit 100 according to the first embodiment.

As shown in FIG. 5, the second multiplier 9 includes a third multiplier 9a, an adder 9b, and a fourth multiplier 9c.

The third multiplier 9a multiplies the modulation frequency data (Fmod/Fref) by a coefficient "A" and outputs the multiplication result.

The adder 9b adds the first coefficient "Kc" to the output of the third multiplier 9a and outputs the addition result.

The fourth multiplier 9c multiplies the output of the adder 9b by the modulation data (Fmod/Fref) and outputs the multiplication result as the modulation frequency control value "OTWmod".

Thus, as described above, the second coefficient "Km" of the second multiplier 9 has the relationship of Km=Kc+A× Fmod/Fref ("A" is a correction term (real number)).

The following will describe an example of a method of determining the first coefficient "Kc" and the correction term "A".

Figure 6:
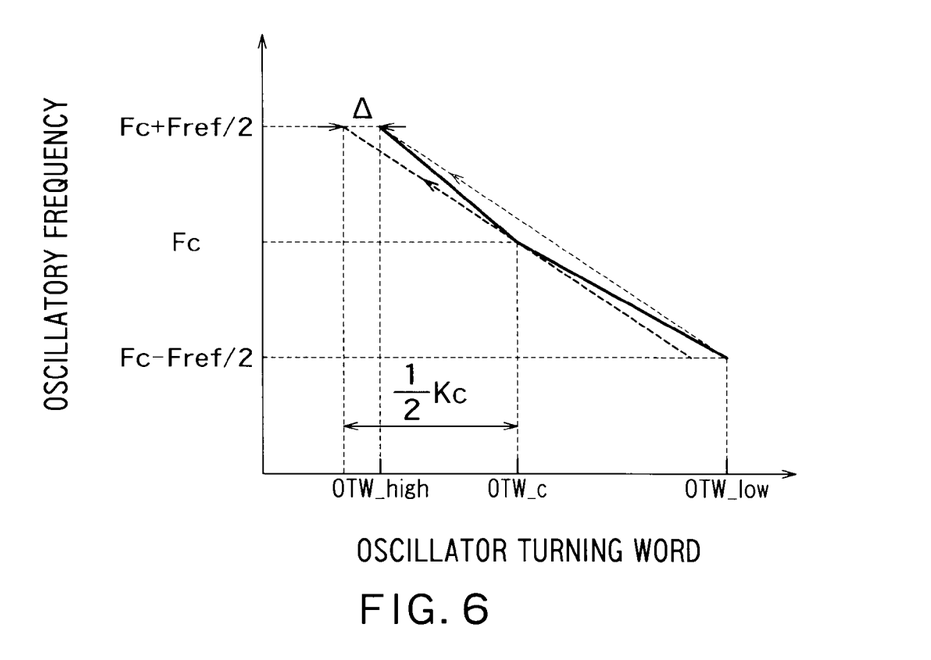
FIG. 6 is an explanatory graph showing an example of the correction of the oscillator tuning word "OTW" according to the oscillatory frequency "Fdco"

FIG. 6 is an explanatory drawing showing an example of the correction of the oscillator tuning word "OTW" according to the oscillatory frequency "Fdco".

As described above, when the operating frequency of the ADPLL is the reference frequency "Fref", it is only necessary to output a frequency of ±Fref/2 relative to the carrier frequency "Fc" in order to perform phase modulation of 2π. As has been illustrated in FIG. 3, the oscillatory frequency "Fdco" during phase modulation has the largest error at Fc±Fref/2 which is the farthest from the carrier frequency "Fc".

Thus as shown in FIG. 6, at three frequencies of the carrier frequency "Fc" and Fc±Fref/2 relative to the carrier frequency "Fc", oscillator tuning words "OTWc", "OTWhigh", and "OTWlow" are obtained.

As has been discussed, the first coefficient "Kc" is expressed by formula (1) below:

$$Kc = Fref/Kdco \quad (1)$$

By using the oscillator tuning word "OTWlow" which corresponds to an oscillatory frequency (Fc−Fref/2) obtained by subtracting a half of the reference frequency "Fref" from the carrier frequency "Fc" and the oscillator tuning word "OTWhigh" which corresponds to an oscillatory frequency (Fc+Fref/2) obtained by adding a half of the reference frequency "Fref" to the carrier frequency "Fc", the gain "Kdco" of the digital control oscillator is expressed by formula (2) below:

$$Kdco = \{(Fc+Fref/2)-(F-+Fref/2)\}/(OTWlow-OTWhigh) \quad (2)$$

Thus based on formulas (1) and (2), the first coefficient "Kc" has a relationship expressed by formula (3) below:

$$Kc = OTWlow - OTWhigh \quad (3)$$

In this case, in normalization using the reference frequency "Fref", the maximum value and the minimum value of the modulation frequency data (Fmod/Fref) can be expressed by ±½. A difference between the maximum value and the minimum value of the modulation frequency data (Fmod/Fref) is "1", that is, the difference corresponds to the normalized reference frequency "Fref".

Thus the first coefficient Kc can be simply expressed by a difference between the maximum value and the minimum value of the oscillator tuning word "OTW" as expressed in formula (3).

As described above, the first coefficient "Kc" is the difference of the oscillator tuning word "OTW" when the oscillatory frequency "Fdco" is Fc±Fref/2.

Assuming that the difference of the oscillator tuning word "OTW" at Fc±Fref/2 is the first coefficient "Kc", a difference between a necessary oscillator tuning word "OTW" and an actual oscillator tuning word "OTW" is expressed by Δ as shown in FIG. 6.

In other words, Δ is expressed by formula (4). As has been discussed, "OTWc" is the oscillator tuning word corresponding to the carrier frequency.

$$\Delta = \tfrac{1}{2} \times Kc - (OTW\text{high} - OTWc) \quad (4)$$

Further, the correction term "A" has a relationship expressed by formula (5) below:

$$A = -4 \times \Delta = -4 \times \{\tfrac{1}{2} \times Kc - (OTW\text{high} - OTWc)\} \quad (5)$$

As has been discussed, the second coefficient "Km" has a relationship expressed by formula (6) below:

$$Km = Kc + A \times Fmod/Fref \quad (6)$$

Thus based on formula (6), the modulation frequency control value "OTWmod" is expressed by formula (7) below:

$$\begin{aligned} OTWmod &= Km \times Fmod/Fref \\ &= (Kc + A \times Fmod/Fref) \times Fmod/Fref \\ &= \alpha Fmod + \beta Fmod^2 \end{aligned} \quad (7)$$

where $\alpha = Kc/Fref$ and $\beta = A/Fref^2$ are satisfied.

As expressed in formulas (6) and (7), the second coefficient "Km" has a linear slope proportionate to the modulation frequency data (Fmod/Fref). The modulation frequency control value "OTWmod" is obtained by multiplying the second coefficient "Km" by the modulation frequency data (Fmod/Fref).

As a result, the oscillator tuning word "OTW" is smoothed by the modulation frequency control value "OTWmod" having a quadratic slope.

Based on formulas (5) and (7), the modulation frequency control value "OTWmod" corresponding to the maximum modulation frequency (½Fref) is expressed by formula (8) below:

$$\begin{aligned} OTWmod(1/2Fref) &= (Kc + 1/2 \times A) \times 1/2 \\ &= 1/2 \times (Kc - 1/2 \times \Delta) \\ &= OTW\text{high} - OTWc \end{aligned} \quad (8)$$

Thus the oscillator tuning word "OTW" corresponding to the maximum modulation frequency (½Fref) is expressed by formula (9) below:

$$\begin{aligned} OTW(1/2Fref) &= OTWmod(1/2Fref) + OTWc \\ &= OTW\text{high} \end{aligned} \quad (9)$$

The following will describe another example of the method of determining the correction term "A".

Figure 7:
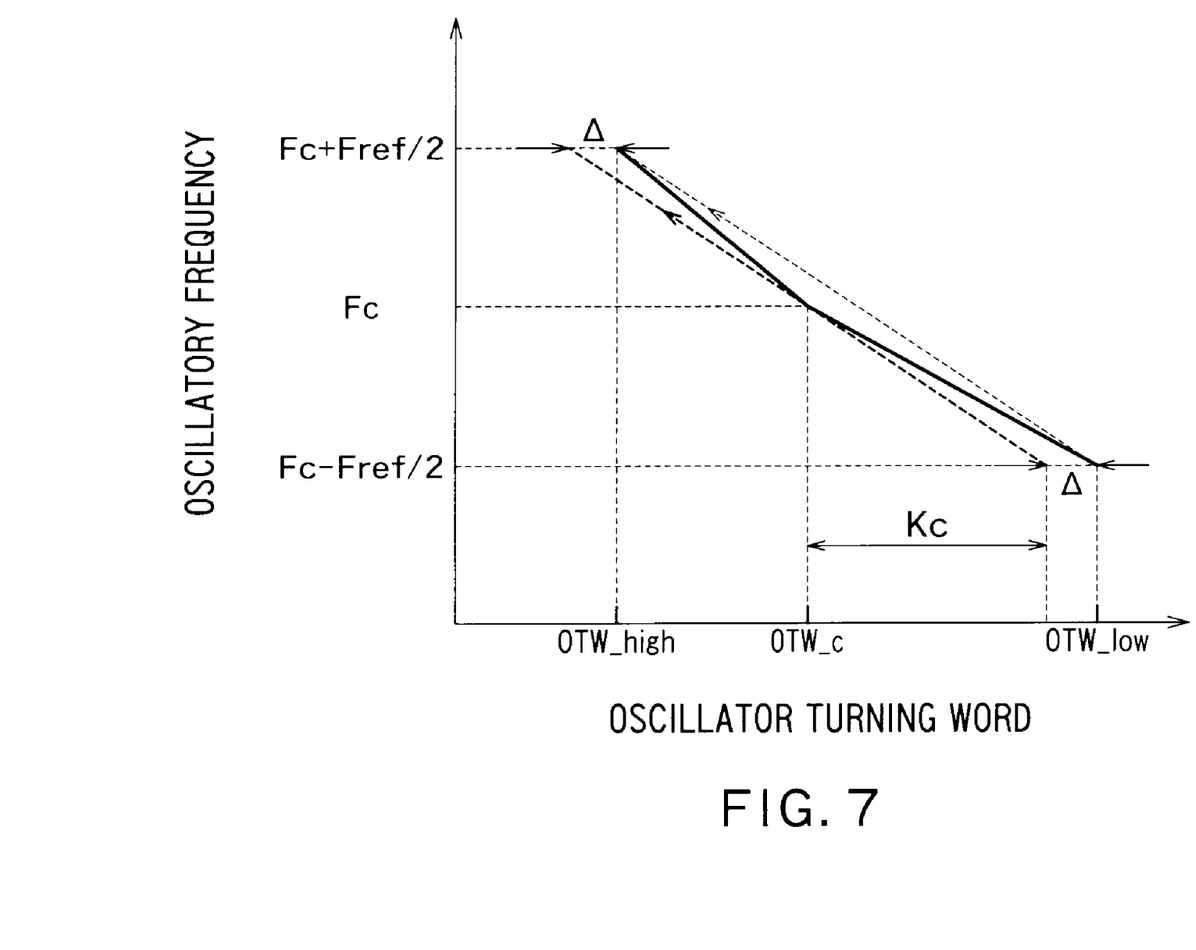
FIG. 7 is an explanatory graph showing another example of the correction of the oscillator tuning word "OTW" according to the oscillatory frequency "Fdco"

FIG. 7 is an explanatory drawing showing another example of the correction of the oscillator tuning word "OTW" according to the oscillatory frequency "Fdco".

As expressed in formula (3), the first coefficient "Kc" is OTWlow−OTWhigh. Thus as shown in FIG. 7, Δ can be obtained as in FIG. 6 also relative to "OTWlow".

In other words, Δ is expressed by formula (10) below. As has been discussed, "OTWc" is an oscillator tuning word corresponding to the carrier frequency.

$$\Delta = (OTWc - OTW\text{low}) - \tfrac{1}{2} \times Kc \quad (10)$$

Further, the correction term "A" has a relationship expressed by formula (11) below:

$$A = -4 \times A = \{(OTWc - OTW\text{low}) - \tfrac{1}{2} \times Kc\} \quad (11)$$

The second coefficient Km, the modulation frequency control value "OTWmod", and the oscillator tuning word "OTW" are determined as has been discussed.

In the present embodiment, it should be noted that a frequency is smoothed by complementation using a quadratic curve. The nonlinearity is originally proportionate to $1/\sqrt{LC}$. However, it should be noted that a wide band within several tens MHz can be sufficiently complemented by a quadratic function.

The normalized modulation frequency can be represented as $\pm\tfrac{1}{2}$ at the maximum and the total modulation frequency can be represented as 1, so that the first coefficient "Kc" at the carrier frequency can be expressed only by subtraction. Thus the present embodiment is excellent in that unnecessary operations can be eliminated.

In this way, the first coefficient "Kc" and the correction term "A" are determined and the second coefficient "Km" is set in the communication semiconductor integrated circuit 100.

Thus the communication semiconductor integrated circuit 100 can offset the nonlinearity depending upon $1/\sqrt{LC}$ of a change of the oscillatory frequency relative to the oscillator tuning word "OTW" in a wide band, and can transmit data while keeping the formed feedback loop of a PLL.

In other words, the communication semiconductor integrated circuit 100 has a signal path for normalizing the gain "Kdco" of the digital control oscillator 1 in addition to a feedback path, and the gain uses a coefficient proportionate to the modulation frequency data (Fmod/Fref).

As a result, the oscillator tuning word "OTW" has a quadratic smoothing term for the modulation frequency data (Fmod/Fref) and offsets nonlinear effect.

The oscillatory frequency "Fdco" has an error caused by $1/\sqrt{LC}$ in the digital control oscillator and is defined as a smoothing term having a quadratic slope, so that a complicated operation of $\sqrt{}$ is not necessary. Further, the error is multiplied by a coefficient separately from the feedback loop.

Thus it is possible to establish a PLL operation and a modulating operation in a wide band.

Figure 8:
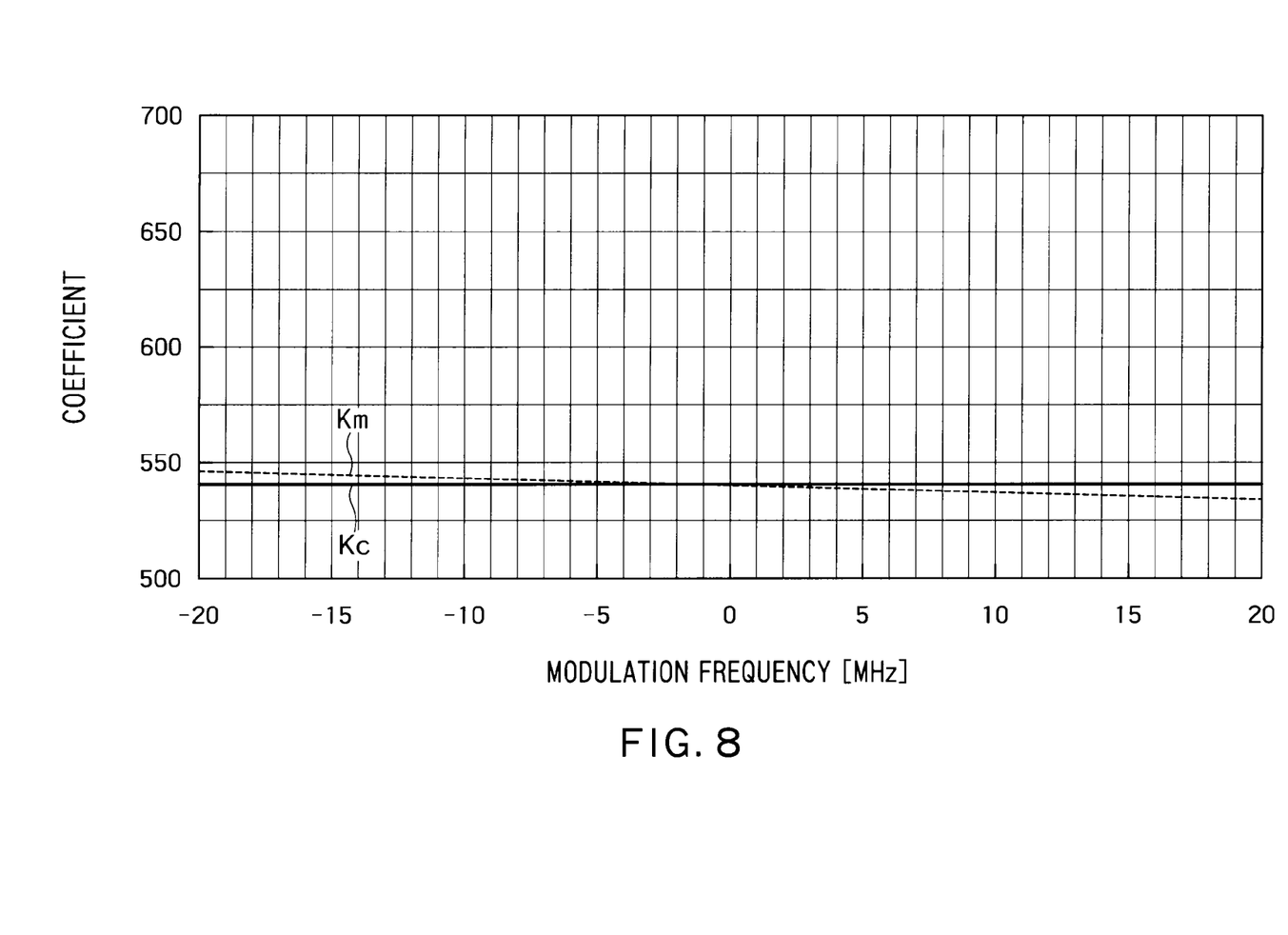
FIG. 8 is a graph showing the relationship among the modulation frequency "Fmod", the coefficients "Kc" and "Km", and the gain of the digital control oscillator in the communication semiconductor integrated circuit 100 according to the first embodiment.

FIG. 8 shows the relationship among the modulation frequency "Fmod", the coefficients "Kc" and "Km", and the gain of the digital control oscillator in the communication semiconductor integrated circuit 100 according to the first embodiment.

As shown in FIG. 8, the second coefficient "Km" changes with the modulation frequency "Fmod".

Figure 9:
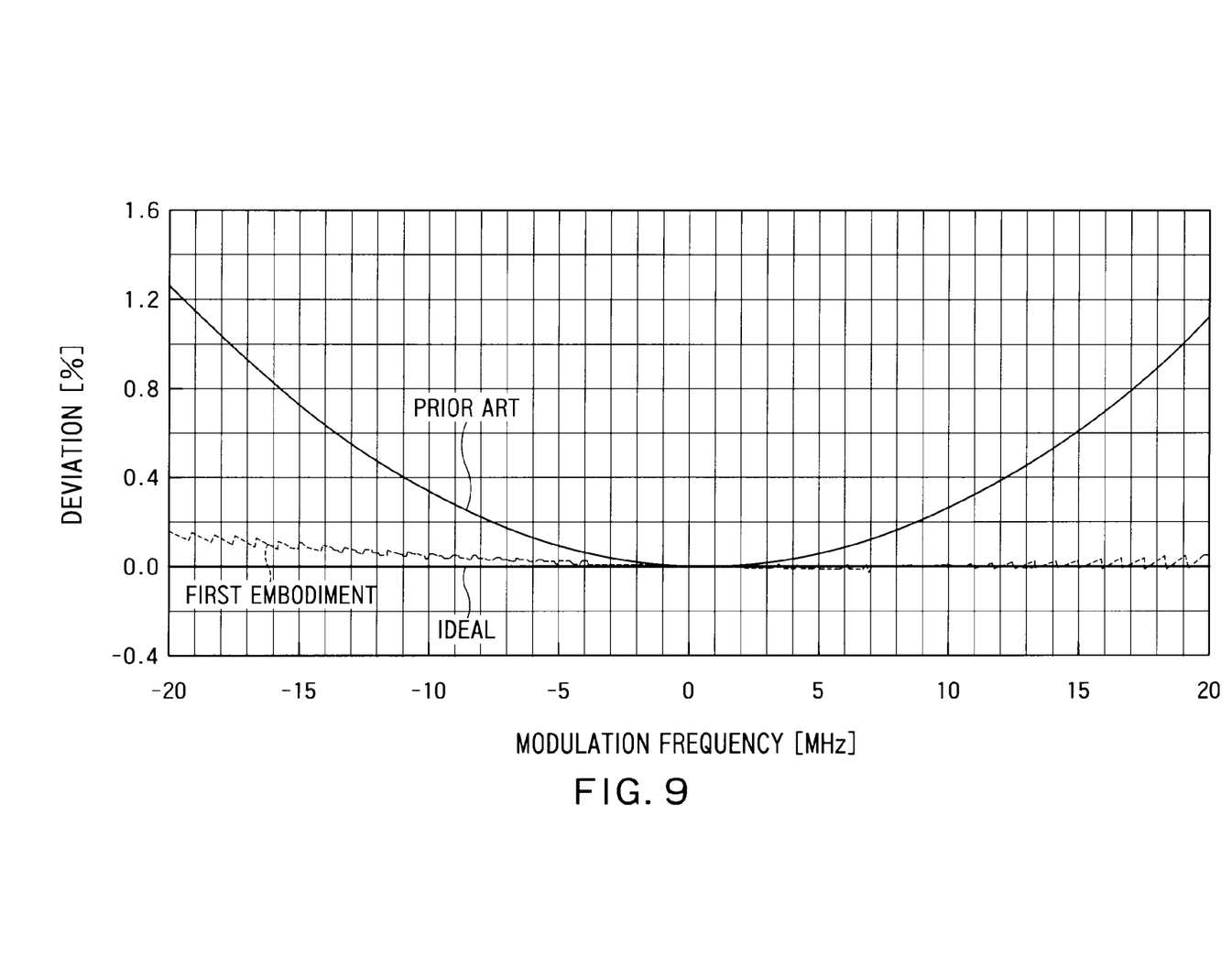
FIG. 9 is a graph showing the relationship between the modulation frequency and a deviation of an actually outputted oscillatory frequency from an oscillatory frequency set according to the modulation frequency.

FIG. 9 shows the relationship between the modulation frequency and a deviation of an actually outputted oscillatory frequency from an oscillatory frequency set according to the modulation frequency.

As shown in FIG. 9, in the prior art, the deviation increases with the absolute value of the modulation frequency.

On the other hand, in the present embodiment, the oscillatory frequency "Fmod" linearly changes relative to the modulation frequency "Fmod", which is close to the ideal case.

As described above, in the present embodiment, the frequency is high at positive and negative gains which are constant relative to the carrier frequency. Thus a correct modulation frequency at a higher frequency than the carrier frequency is obtained by complementation with a higher gain than the average gain, and a correct modulation frequency at a lower frequency than the carrier frequency is obtained by complementation with a lower gain than the average gain.

Thus a frequency conversion error decreases and ideal frequency modulation is performed in a wide band, so that phase modulation can be performed with high accuracy.

Further, by using a half frequency of the reference frequency, the gain of the digital control oscillator is obtained according to a difference in the oscillator tuning word "OTW" between a high detuning frequency and a low detuning frequency.

Moreover, the linear complementation does not require a complicated computing mechanism including another function, thereby suppressing an increase in circuit size and power consumption during correction.

In this case, a circuit having a low data rate generally has a low clock for generating data, so that the power consumption can be reduced by switching clocks.

Also when the oscillatory frequency decreases with an increase in control value, an error and linear complementation can be smoothed in a similar manner, achieving the same effect.

As described above, the communication semiconductor integrated circuit according to the present embodiment can increase the accuracy of frequency modulation and phase modulation.

Second Embodiment

In the present embodiment, the frequency (reference frequency "Fref") of a clock signal (reference signal) for operating a PLL circuit and a frequency for generating a modulation signal are different by Kr times.

Figure 10:
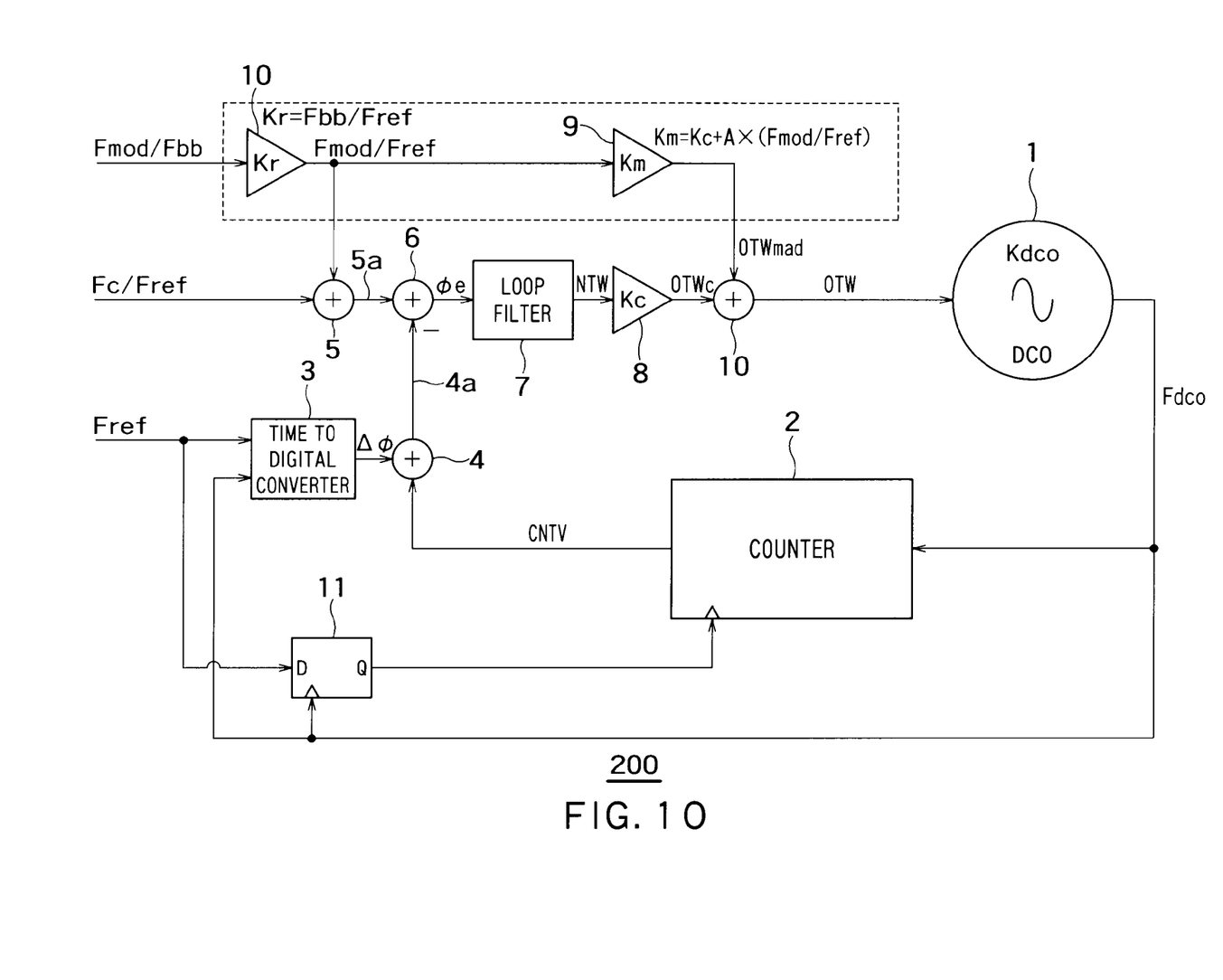
FIG. 10 is a block diagram showing an example of the configuration of a communication semiconductor integrated circuit 200 according to a second embodiment which is an aspect of the present invention.

FIG. 10 shows an example of the configuration of a communication semiconductor integrated circuit 200 according to a second embodiment which is an aspect of the present invention. In FIG. 10, configurations indicated by the same reference numerals as FIG. 1 are the same configurations as FIG. 1.

As shown in FIG. 10, the communication semiconductor integrated circuit 200 is fed with modulation frequency data (Fmod/Fbb) obtained by dividing a modulation frequency "Fmod" by a baseband frequency "Fbb". The communication semiconductor integrated circuit 200 further includes a third multiplier 10, unlike the communication semiconductor integrated circuit 100 of the first embodiment.

The third multiplier 10 multiplies the modulation frequency data (Fmod/Fbb) by a coefficient "Kr" (Kr=Fbb/Fref) and outputs the multiplication value to a second computing element 5 and a second multiplier 9 as the modulation frequency data (Fmod/Fref).

The communication semiconductor integrated circuit 200 configured thus can operate the second multiplier 9 and the third multiplier 10, which are surrounded by a dotted line, at the baseband frequency "Fbb". Other configurations are operated at the reference frequency "Fref".

Thus when the baseband frequency "Fbb" is lower than the reference frequency "Fref", the power consumption of the third multiplier 10 can be reduced as compared with the first embodiment.

Configurations other than the third multiplier 10 in the communication semiconductor integrated circuit 200 are operated as in the communication semiconductor integrated circuit 100 of the first embodiment. Thus the communication semiconductor integrated circuit 200 can increase the accuracy of frequency modulation and phase modulation as in the first embodiment.

As described above, the communication semiconductor integrated circuit according to the present embodiment can increase the accuracy of frequency modulation and phase modulation. Further, the communication semiconductor integrated circuit according to the present embodiment can further reduce power consumption.

What is claimed is:

1. A communication semiconductor integrated circuit, comprising:
a digital control oscillator capable of controlling an oscillatory frequency of an oscillation signal based on an oscillator tuning word which is a digital value;
a counter which counts a wave number of the oscillation signal and outputs a count value;
a time to digital converter which outputs a phase difference value between a reference signal and the oscillation signal as a digital value;
a first computing element which adds the count value and the phase difference value and outputs a first computed value as an addition result;
a second computing element which adds set frequency data obtained by dividing a carrier frequency by a reference frequency of the reference signal and modulation frequency data obtained by dividing a modulation frequency by the reference frequency, and outputs a second computed value as an addition result;
a third computing element which subtracts the second computed value from the first computed value and outputs a third computed value as a subtraction result, the third computed value being a phase error;
a loop filter which outputs a normalized control value obtained by filtering the third computed value;
a first multiplier which outputs a carrier frequency control value obtained by multiplying an output of the loop filter by a first coefficient;
a second multiplier which outputs a modulation frequency control value obtained by multiplying the modulation frequency data by a second coefficient; and
a fourth computing element which adds the carrier frequency control value and the modulation frequency control value, and outputs the oscillator tuning word as an addition result,
wherein the second coefficient "Km" has a relationship of:

$$Km = Kc + A \times Fmod/Fref$$

where "Kc" is the first coefficient, "A" is a correction term as a real number, "Fmod" is the modulation frequency, and "Fref" is the reference frequency.

2. The communication semiconductor integrated circuit according to claim 1, wherein the first coefficient is a value obtained by dividing the reference frequency by a gain of the digital control oscillator.

3. The communication semiconductor integrated circuit according to claim 2, wherein the first coefficient "Kc" has a relationship of:

$$Kc = OTWlow - OTWhigh$$

where "OTWlow" is the oscillator tuning word corresponding to the oscillatory frequency obtained by subtracting a half of the reference frequency from the carrier frequency, and "OTWhigh" is the oscillator tuning word corresponding to the oscillatory frequency obtained by adding a half of the reference frequency to the carrier frequency.

4. The communication semiconductor integrated circuit according to claim 3, wherein the correction term "A" has a relationship of:

$$A = -4 \times \{\tfrac{1}{2} \times Kc - (OTWhigh - OTWc)\}$$

where "OTWc" is the oscillator tuning word corresponding to the carrier frequency.

5. The communication semiconductor integrated circuit according to claim 3, wherein the correction term "A" has a relationship of:

$$A = -4 \times \{(OTWc - OTWlow) - \tfrac{1}{2} \times Kc\}$$

where "OTWc" is the oscillator tuning word corresponding to the carrier frequency.

6. The communication semiconductor integrated circuit according to claim 1, wherein the digital control oscillator has an inverter circuit, an inductor connected in parallel with the inverter circuit, and n variable capacitors connected in parallel with the inductor, the inductor and the variable capacitors compose a resonator, and the variable capacitors have capacitances controlled according to the oscillator tuning word.

7. The communication semiconductor integrated circuit according to claim 2, wherein the digital control oscillator has an inverter circuit, an inductor connected in parallel with the inverter circuit, and n variable capacitors connected in parallel with the inductor, the inductor and the variable capacitors compose a resonator, and the variable capacitors have capacitances controlled according to the oscillator tuning word.

8. The communication semiconductor integrated circuit according to claim 3, wherein the digital control oscillator has an inverter circuit, an inductor connected in parallel with the inverter circuit, and n variable capacitors connected in parallel with the inductor, the inductor and the variable capacitors compose a resonator, and the variable capacitors have capacitances controlled according to the oscillator tuning word.

9. The communication semiconductor integrated circuit according to claim 4, wherein the digital control oscillator has an inverter circuit, an inductor connected in parallel with the inverter circuit, and n variable capacitors connected in parallel with the inductor, the inductor and the variable capacitors compose a resonator, and the variable capacitors have capacitances controlled according to the oscillator tuning word.

10. The communication semiconductor integrated circuit according to claim 5, wherein the digital control oscillator has an inverter circuit, an inductor connected in parallel with the inverter circuit, and n variable capacitors connected in parallel with the inductor, the inductor and the variable capacitors compose a resonator, and the variable capacitors have capacitances controlled according to the oscillator tuning word.

* * * * *